(12) United States Patent
Kambhampati et al.

(10) Patent No.: US 9,548,388 B1
(45) Date of Patent: Jan. 17, 2017

(54) FORMING FIELD EFFECT TRANSISTOR DEVICE SPACERS

(71) Applicants: International Business Machines Corporation, Armonk, NY (US); GlobalFoundries, Inc., Grand Cayman (KY)

(72) Inventors: Rama Kambhampati, Milpitas, CA (US); Junli Wang, Singerlands, NY (US); Ruilong Xie, Schenectady, NY (US); Tenko Yamashita, Schenectady, NY (US)

(73) Assignees: INTERNATIONAL BUSINESS MACHINES CORPORATION, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/817,504

(22) Filed: Aug. 4, 2015

(51) Int. Cl.
*H01L 29/78* (2006.01)
*H01L 21/8238* (2006.01)
*H01L 27/092* (2006.01)
*H01L 29/66* (2006.01)

(52) U.S. Cl.
CPC ... *H01L 29/7848* (2013.01); *H01L 21/823807* (2013.01); *H01L 21/823814* (2013.01); *H01L 21/823821* (2013.01); *H01L 21/823864* (2013.01); *H01L 27/0924* (2013.01); *H01L 29/66545* (2013.01)

(58) Field of Classification Search
CPC .............. H01L 29/78; H01L 21/28088; H01L 21/28114; H01L 29/66492; H01L 29/66545
See application file for complete search history.

(56) References Cited

U.S. PATENT DOCUMENTS 6,864,135 B2   3/2005   Grudowski et al.
7,892,932 B2   2/2011   Cheng et al.
8,278,166 B2   10/2012   Chen et al.
(Continued)

OTHER PUBLICATIONS

V. S. Basker et al., "Method of Forming a Complementary Metal Oxide Semiconductor Structure With N-Type and P-Type Field Effect Transistors Having Symmetric Source/Drain Junctions and Optional Dual Silicides," U.S. Appl. No. 14/614,489, filed Feb. 5, 2015.
(Continued)

*Primary Examiner* — Phuc Dang
(74) *Attorney, Agent, or Firm* — Cantor Colburn LLP; Vazken Alexanian

(57) ABSTRACT

A method for forming field effect transistors comprises forming a first dummy gate stack over a first fin, forming a second dummy gate stack over a second fin, depositing a first layer of spacer material on the first dummy gate stack, the first fin, the second dummy gate stack, and the second fin, patterning a first masking layer on the first dummy gate stack and the first fin, etching to remove portions of the first layer of spacer material and form a spacer adjacent to the second dummy gate stack, removing the first masking layer, epitaxially growing a silicon material on the second fin, depositing a layer of oxide material on the first layer of spacer material, the first epitaxial material and the second dummy gate stack, and depositing a second layer of spacer material on the layer of oxide material.

16 Claims, 15 Drawing Sheets

(56) References Cited

U.S. PATENT DOCUMENTS

| | | |
|---|---|---|
| 8,609,497 B2 | 12/2013 | Chung et al. |
| 8,647,953 B2 | 2/2014 | Liao et al. |
| 8,709,930 B2 | 4/2014 | Tsai et al. |
| 8,895,396 B1 | 11/2014 | Fu et al. |
| 2011/0169104 A1* | 7/2011 | Xu .................... H01L 21/26506 257/410 |
| 2013/0178024 A1 | 7/2013 | Flachowsky et al. |
| 2014/0377926 A1* | 12/2014 | Kim ................. H01L 29/66795 438/289 |
| 2015/0035069 A1 | 2/2015 | Hung et al. |
| 2015/0145064 A1* | 5/2015 | Ramachandran ..... H01L 29/785 257/401 |
| 2016/0086796 A1* | 3/2016 | Chan ................ H01L 21/02236 257/347 |

OTHER PUBLICATIONS

List of IBM Patents or Patent Applications Treated as Related; (Appendix P), Filed Sep. 2, 2016; 2 pages.
Rama Kambhampati, et al., "Field Effect Transistor Device Spacers," U.S. Appl. No. 15/085,376, filed Mar. 30, 2016.
Rama Kambhampati, et al., "Field Effect Transistor Device Spacers," U.S. Appl. No. 15/168,725, filed May 31, 2016.

\* cited by examiner

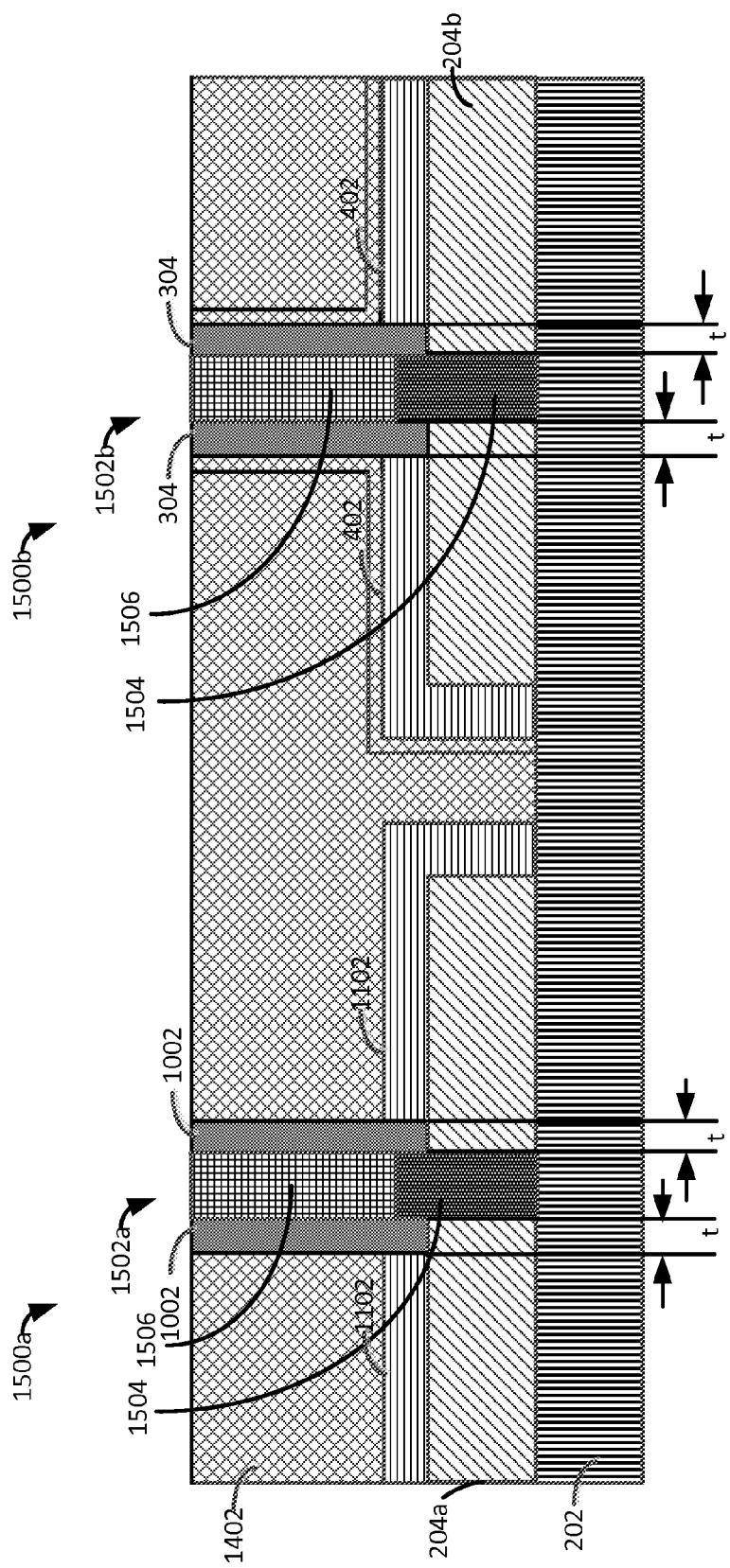

FORMING FIELD EFFECT TRANSISTOR DEVICE SPACERS

BACKGROUND

The present invention relates to field effect transistors (FET), and more specifically, to finFET devices.

FinFET devices typically include semiconductor fins that are arranged on a substrate. Gate stacks are arranged on the fins and define channel regions of the device. The source and drain active regions of the device are adjacent to the channel region.

In fabrication, sacrificial dummy gate stacks are often formed prior to forming the active regions of the device. The dummy gate stacks define the channel region, and are formed from a material such as polysilicon. A material such as nitride or oxide is often used to form spacers adjacent to the gate stacks. The dummy gate stacks allow fabrication processes such as ion implantation and annealing or epitaxial growth process to be performed prior to forming the gate stacks. Such high temperature processes can undesirably degrade the materials in the gate stacks, thus the dummy gate is used to define and protect the channel region while the active regions are formed.

Often a wafer includes nFET and pFET devices. The devices are distinguished by the type of materials in the active regions of the devices. The active regions may be formed by ion implantation and/or epitaxially growing doped silicon materials.

SUMMARY

According to one embodiment of the present invention, a method for forming field effect transistors comprises forming a first dummy gate stack over a first fin, forming a second dummy gate stack over a second fin, depositing a first layer of spacer material on the first dummy gate stack, the first fin, the second dummy gate stack, and the second fin, patterning a first masking layer on the first dummy gate stack and the first fin, etching to remove portions of the first layer of spacer material and form a spacer adjacent to the second dummy gate stack, removing the first masking layer, epitaxially growing a silicon material on the second fin, depositing a layer of oxide material on the first layer of spacer material, the first epitaxial material and the second dummy gate stack, and depositing a second layer of spacer material on the layer of oxide material.

According to another embodiment of the present invention, a method for forming spacers of a field effect transistor comprises patterning a first fin, forming a first dummy gate stack on the first fin, forming a first layer of spacer material on the first fin and the first dummy gate stack, removing portions of the first layer of spacer material to define a spacer adjacent to the first dummy gate stack, epitaxially growing a silicon material on exposed portions of the first fin, forming a layer of oxide material on the silicon material, the spacer, and the dummy gate stack, and forming a second layer of spacer material on the oxide layer.

According to yet another embodiment of the present invention, a field effect transistor device comprises a first semiconductor fin arranged on a substrate, the first semiconductor fin is doped with n-type dopants, a second semiconductor fin arranged on the substrate, the second semiconductor fin is doped with p-type dopants, a first gate stack arranged over the first semiconductor fin, a second gate stack arranged over the second semiconductor fin, a first spacer arranged adjacent to the first gate stack, the first spacer having a substantially uniform thickness, and a second spacer arranged adjacent to the second gate stack, the second spacer having a substantially uniform thickness, wherein the thickness of the first spacer is substantially similar to the thickness of the second spacer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 15 illustrates the resultant structure after a planarizing process.

DETAILED DESCRIPTION

The formation of nFET and pFET devices on a single wafer often includes forming the active regions of the nFET devices and the pFET devices in separate fabrication steps to allow the formation of active regions having different types of dopant materials. For example, when the active regions of the nFET devices are being formed, the pFET devices are protected by a layer of material that prevents exposure of the pFET to the nFET active region fabrication process. Likewise, when the active regions of the pFET devices are being fabricated, the nFET devices are protected to prevent contamination of the nFET devices. This process often results in asymmetric pFET and nFET spacers that affect the performance of the devices. The embodiments described below provide for symmetrical spacers in pFET and nFET devices formed on a substrate.

Figure 1:
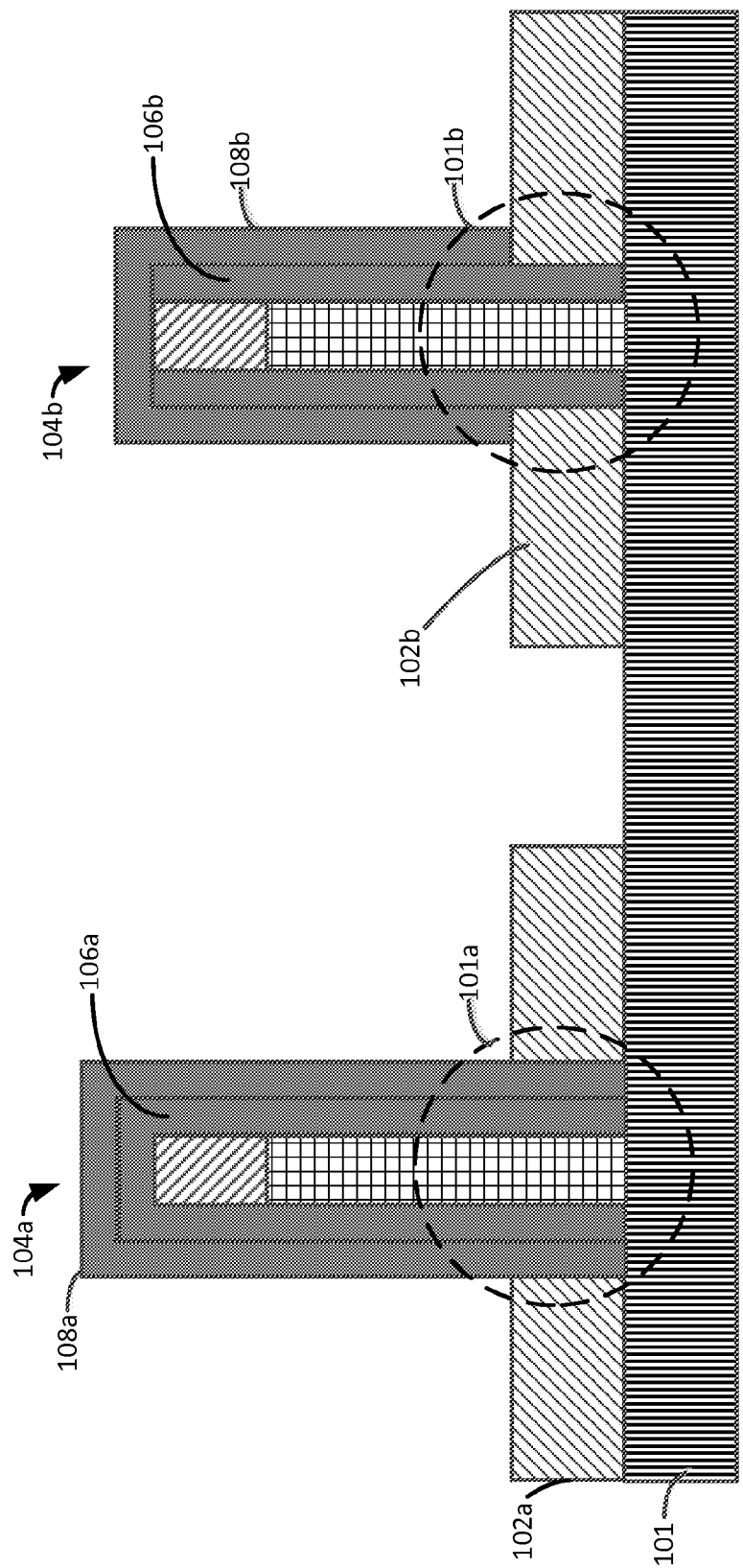
FIG. 1 illustrates a cross sectional view of a two finFET devices.

FIG. 1 illustrates a cross sectional view of two finFET devices having fins 102a and 102b and dummy gate stacks 104a and 104b. A layer of spacer material 106a and 106b is deposited over the devices and formed into spacers. A second layer of spacer material 108 is formed over the devices. In the illustrated example, the active region of the fin 102b has been formed by an epitaxial growth that was performed prior to the deposition of the second layer of spacer material 108, while the spacer 108a was formed prior to the epitaxial growth on the fin 102a. The resulting structure includes finFET devices having asymmetrical spacers 108 where the spacer material 108a at the base of the gate stack 104a in region 101a has a greater thickness than the spacer material 108b at the base of the gate stack 104b in region 101b. When NFET and PFET have different spacer thickness (asymmetrical spacers), forming balanced junctions for good device behavior becomes difficult. Unbalanced junctions may either cause higher external resistance or may short channel control. The thickness of the spacers also affects the contact area, and thus, it is desirable to minimize the spacer thickness.

Figure 2:
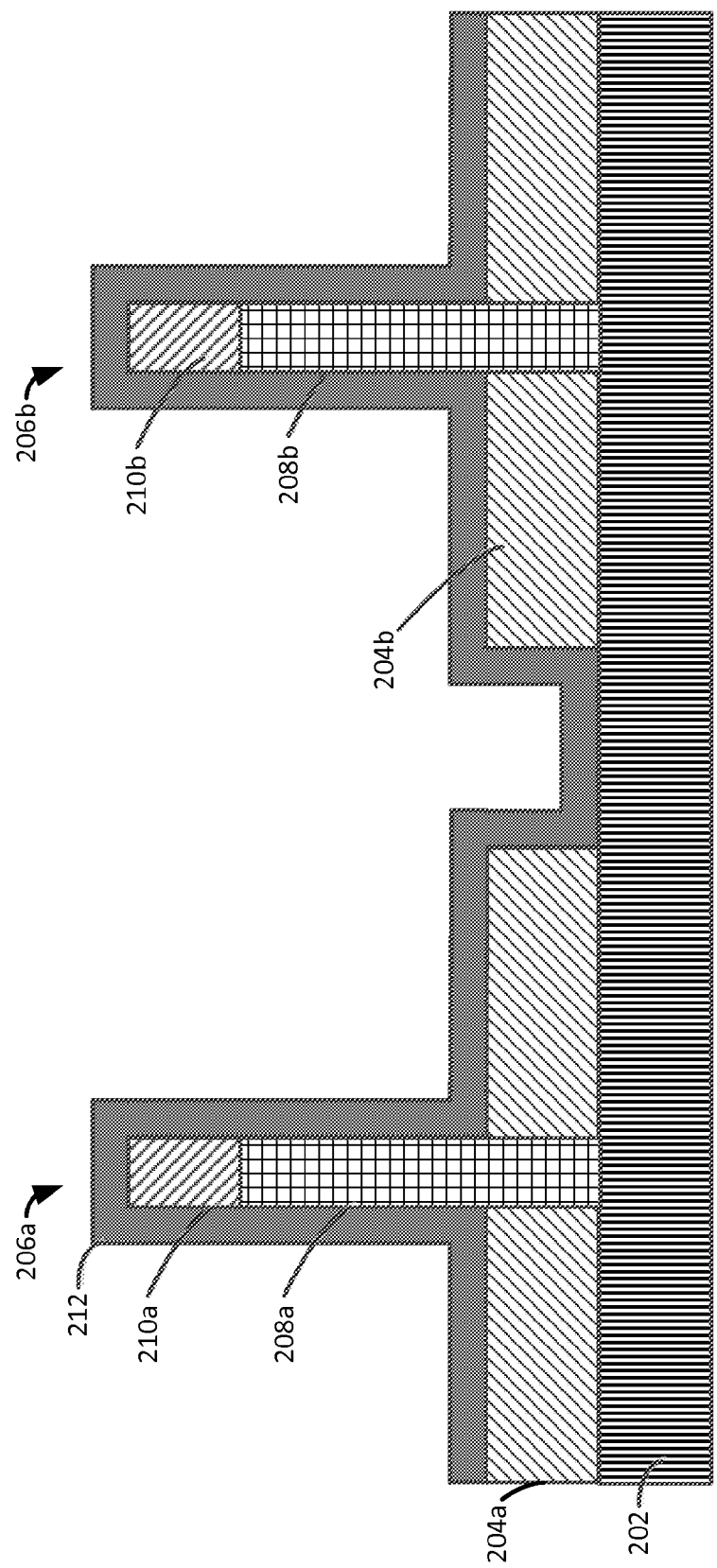
FIG. 2 illustrates a side cut-away view of fins formed on a substrate.

FIGS. 2-15 illustrate an exemplary method of forming symmetrical spacers for nFET and pFET fin FET devices on a wafer. FIG. 2 illustrates a side cut-away view of fins 204a and 204b are formed on a substrate 202 using, for example, a photolithographic patterning and etching method such as reactive ion etching (RIE). Dummy gate stacks 206a and 206b are arranged on the fins 204a and 204b respectively. The dummy gate stacks 206 are formed by for example, depositing a layer of polysilicon material or oxide material 208a and 208b and an oxide or nitride material 210 over the layer of polysilicon material 208a and 208b. The photolithographic patterning and etching process may be used to pattern the dummy gate stacks 206. Following the patterning of the dummy gate stacks 206, a layer of spacer material 212 is deposited over the exposed surfaces. In the illustrated embodiment, the spacer material 212 includes a low-k material such as, for example, SiN, SiBCN, SiOCN, or SiOC that may be deposited by, for example, a chemical vapor deposition (CVD) process.

Figure 3:
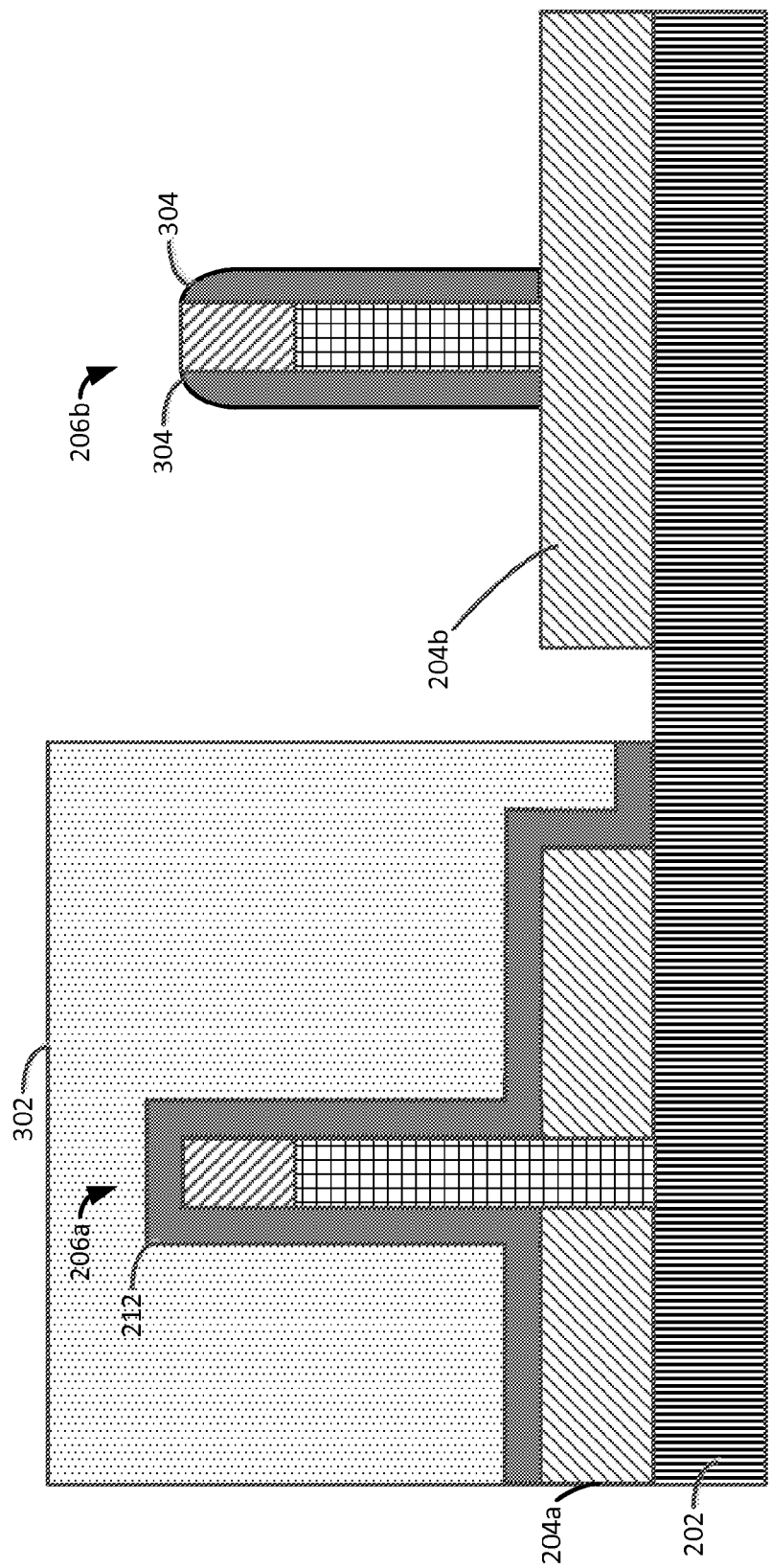
FIG. 3 illustrates the resultant structure following the patterning and deposition of a masking layer.

FIG. 3 illustrates the resultant structure following the patterning and deposition of a masking layer 302 over the dummy gate stack 206a and fin 204a. The masking layer may include, for example, an organic material. After the masking layer 302 is patterned, an anisotropic etching process such as, for example, RIE is performed to form the spacers 304 adjacent to the dummy gate stack 206b. The etching process removes a portion of the spacer material 212 to expose portions of the fin 204b.

Figure 4:
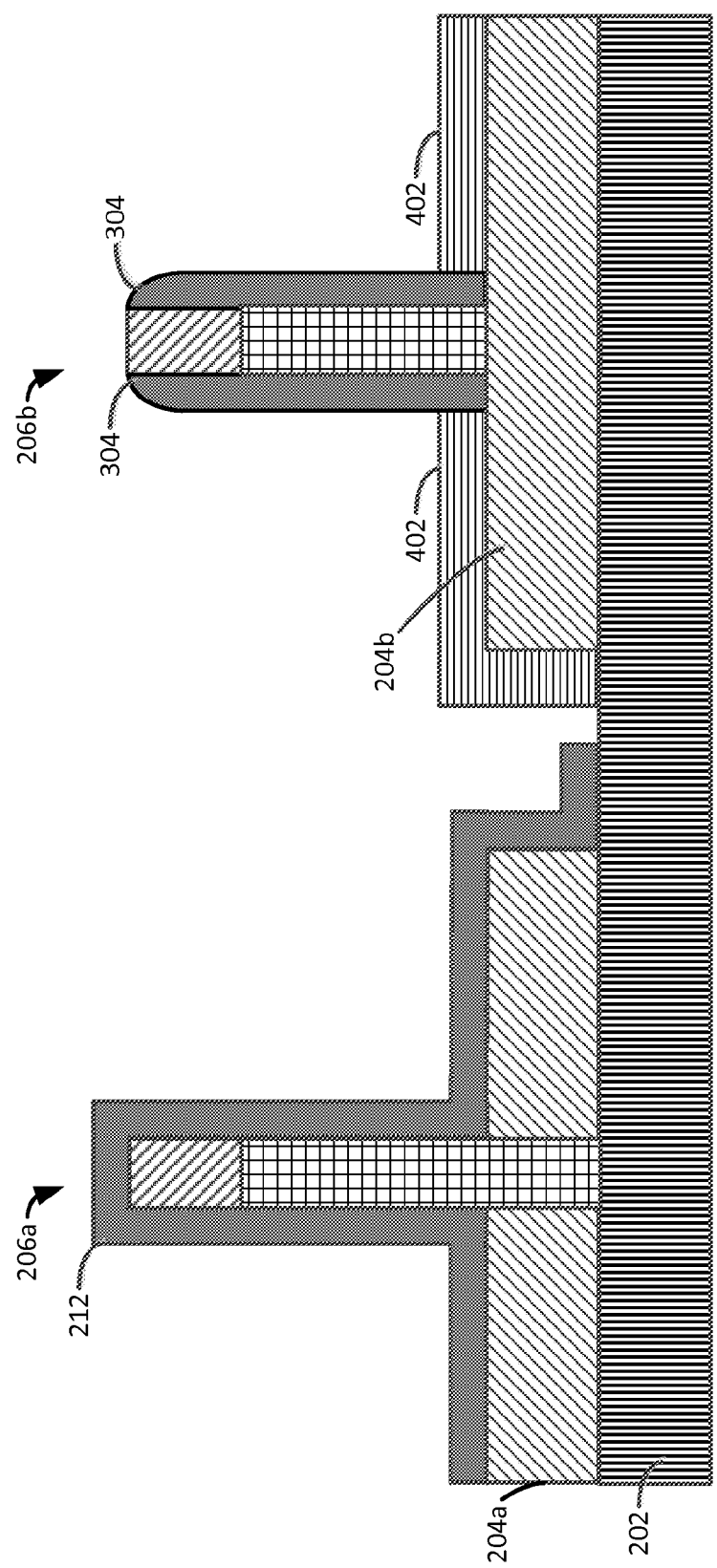
FIG. 4 illustrates the resultant structure following the removal of the masking layer and an epitaxial growth process.

FIG. 4 illustrates the resultant structure following the removal of the masking layer 302 (of FIG. 3) and an epitaxial growth process. The masking layer may be removed by, for example, a plasma ashing process. The epitaxial growth process grows an epitaxial material, such as, for example, silicon or silicon germanium on exposed silicon surfaces of the fin 204b to further define source and drain regions (active regions) 402. The layer of spacer material 212 over the dummy gate stack 206a and the fins 204a protects the silicon material of the fin 204a from seeding the epitaxy. In some embodiments, the epitaxially grown material in the active regions 402 may be in-situ doped with either n-type dopants or p-type dopants during the epitaxial growth process.

Figure 5:
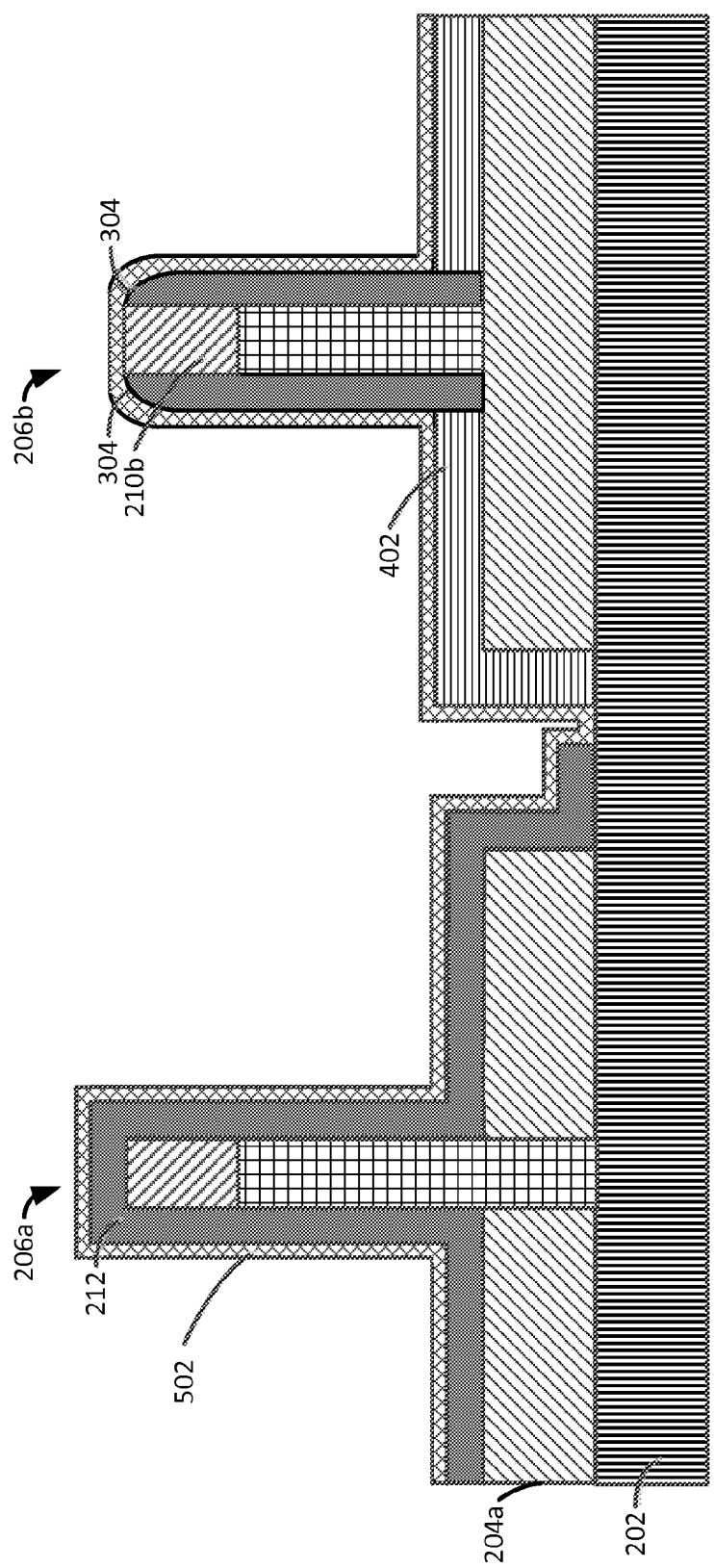
FIG. 5 illustrates the deposition of an oxide layer.

FIG. 5 illustrates the deposition of an oxide layer 502 over the exposed portions of the spacer material layer 212, the spacers 304, the active regions 402, and the dummy gate stacks 206. The oxide layer 502 is relatively thin approximately 1 to 5 nanometers. The oxide layer 502 is formed using, for example a CVD process.

Figure 6:
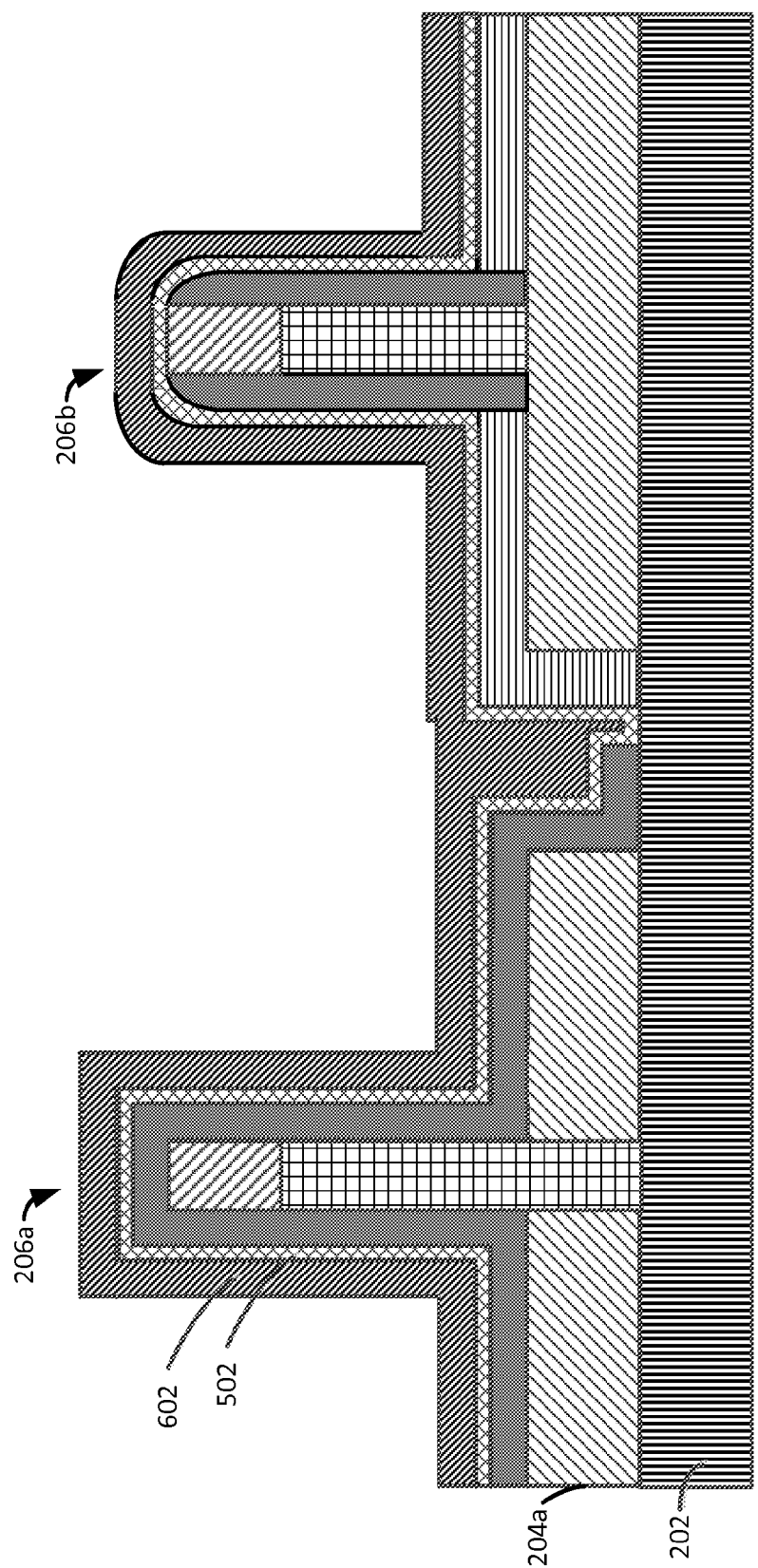
FIG. 6 illustrates the deposition of a second layer of spacer material.

FIG. 6 illustrates the deposition of a second layer of spacer material 602 over the oxide layer 502. The second layer of spacer material 602 may include, for example, a nitride material that is deposited by a CVD process.

Figure 7:
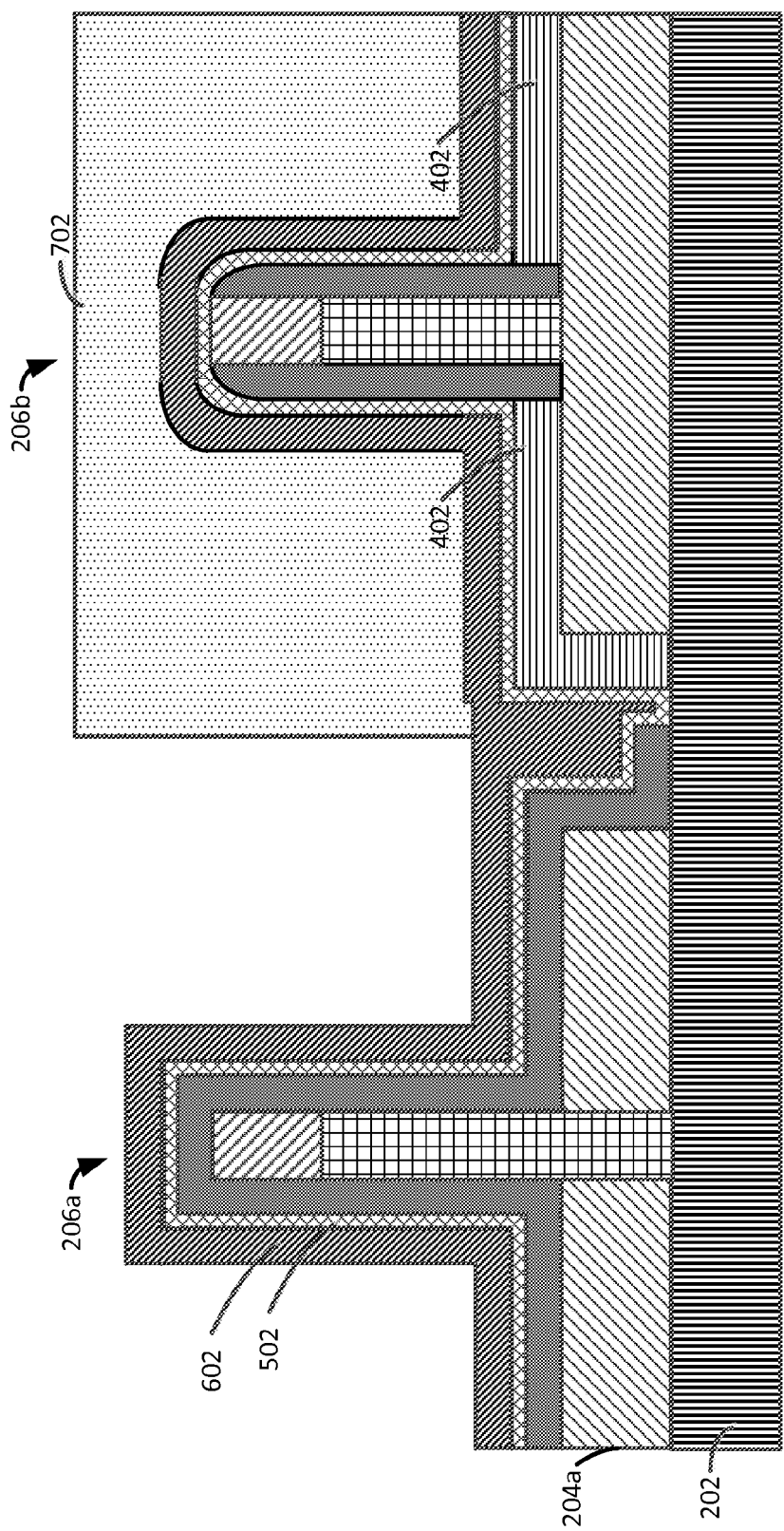
FIG. 7 illustrates the patterning of a mask layer.

FIG. 7 illustrates the patterning of a mask layer 702. The masking layer 702 may be formed by, for example, a lithographic deposition and patterning process. The mask layer 702 is patterned over the second layer of spacer material 602 on the dummy gate stack 206b, and the active regions 402.

Figure 8:
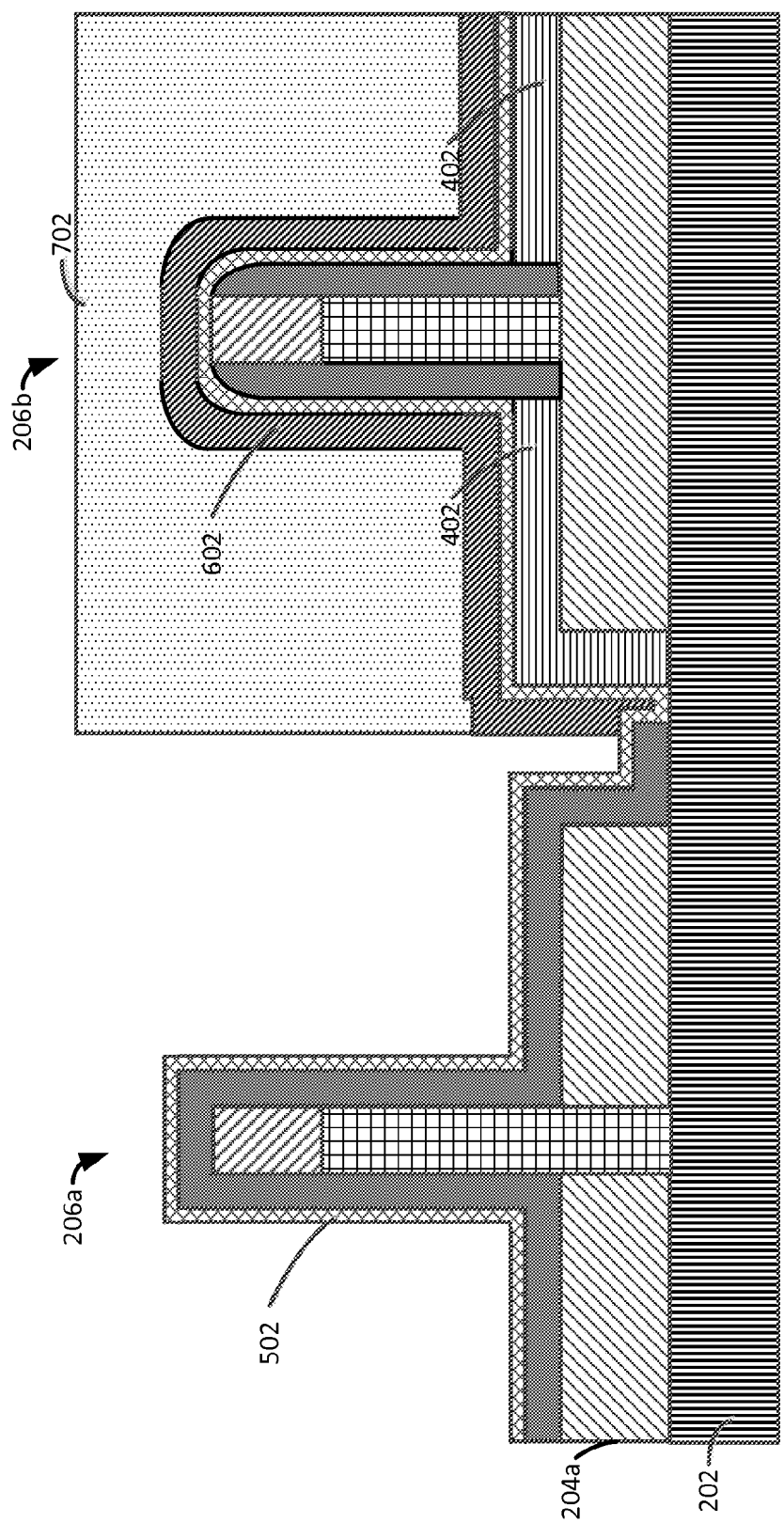
FIG. 8 illustrates the resultant structure following an etching process.

FIG. 8 illustrates the resultant structure following an etching process such as, for example, a chemical wet etching process or a reactive ion etching process that removes the exposed portions of the second layer of spacer material 602. The etching process is selective to the material in the oxide layer 502 such that the oxide layer 502 is exposed, but not substantially etched.

Figure 9:
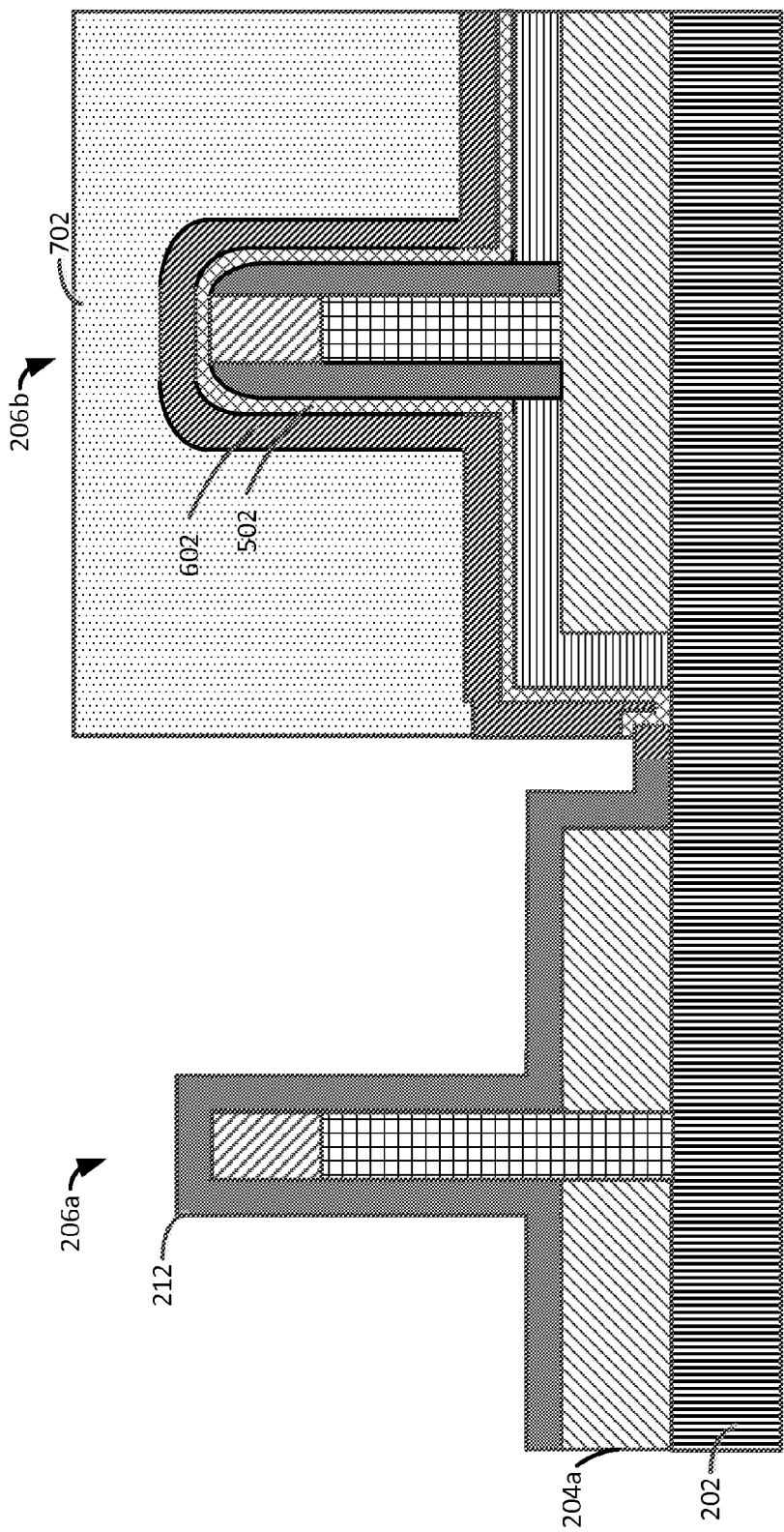
FIG. 9 illustrates the resultant structure following an etching process.

FIG. 9 illustrates the resultant structure following an etching process such as, for example, a diluted hydrofluoric (HF) or a buffered HF etching process. That removes the exposed portions of the oxide layer 502. The removal of the exposed portions of the oxide layer 502 exposes a portion of the spacer material layer 212 over the dummy gate stack 602a and the fin 204a.

Figure 10:
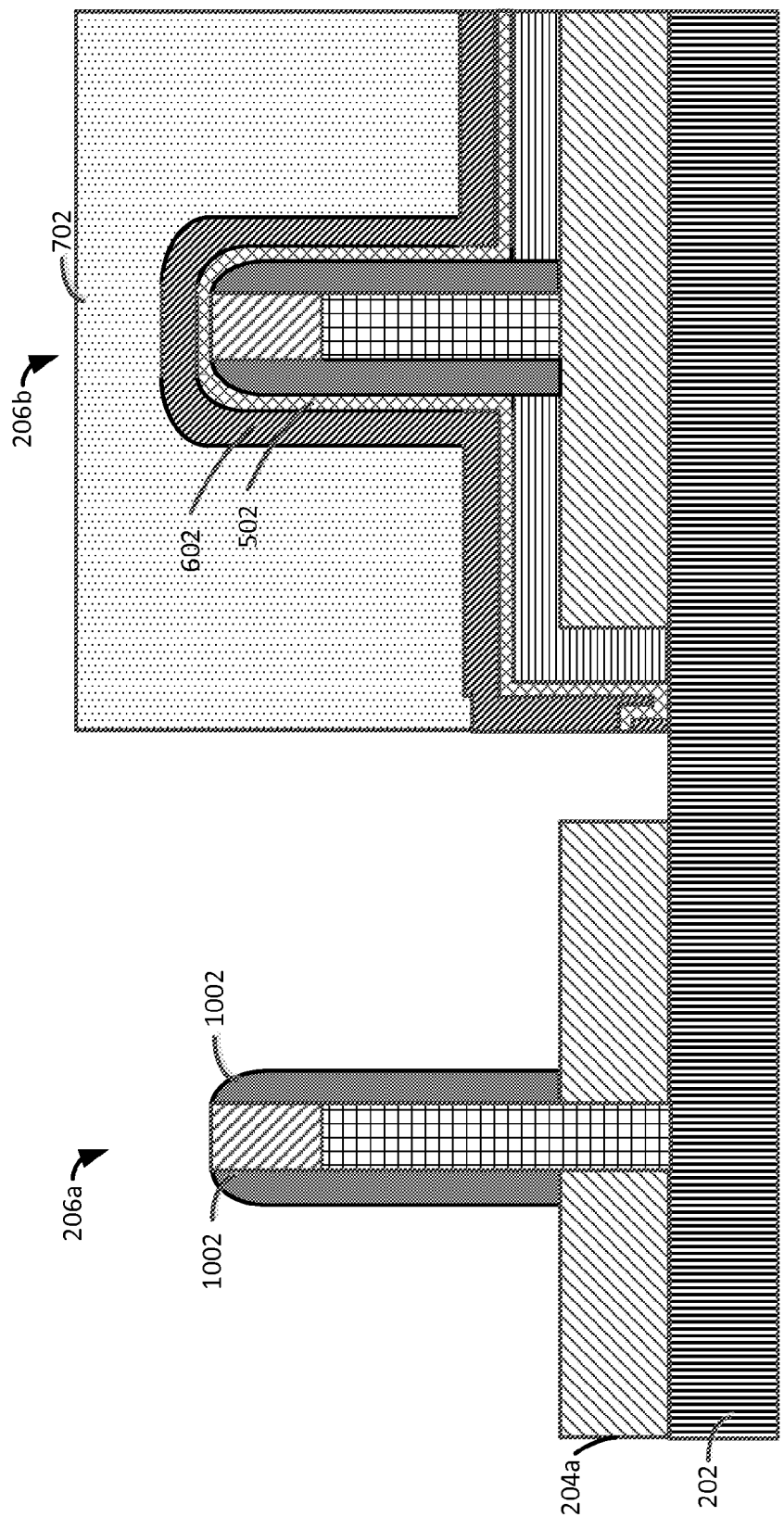
FIG. 10 illustrates the formation of spacers.

FIG. 10 illustrates the formation of spacers 1002 adjacent to the dummy gate stack 206a. The spacers 1002 are formed by an anisotropic etching process such as, for example, RIE that removes the exposed horizontal surfaces of the layer of spacer material layer 212 (of FIG. 9).

Figure 11:
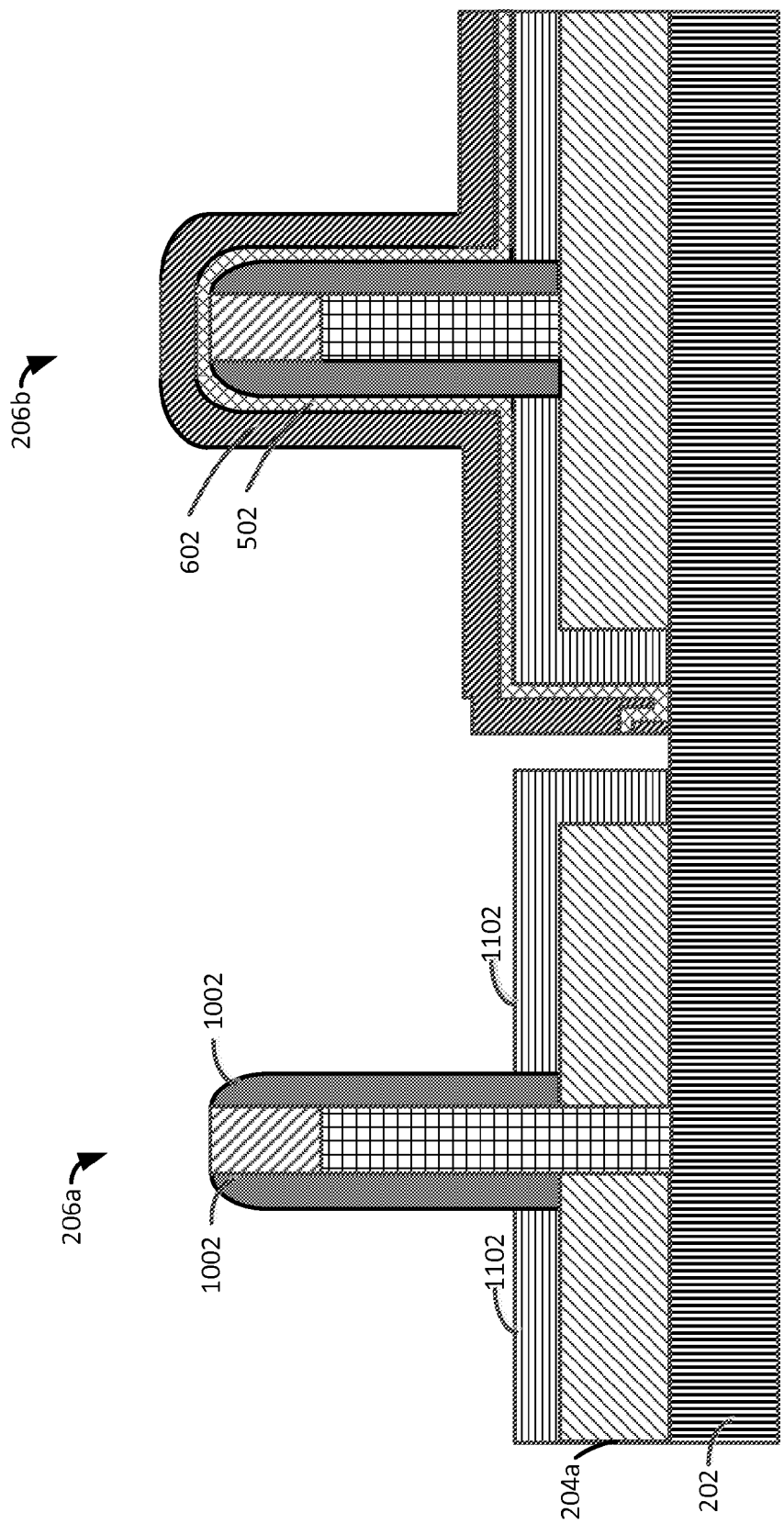
FIG. 11 illustrates the formation of source and drain regions.

FIG. 11 illustrates the formation of source and drain regions (active regions) 1102 using, for example, an epitaxial growth process that grows a silicon material on the exposed portions of the fin 204a. The source and drain regions 1102 may be in-situ doped during the epitaxial growth process with n-type or p-type dopants. In the illustrated embodiment, the source and drain regions 402 and the source and drain regions 1102 are dissimilar. In this regard, in one embodiment, if the regions 402 are doped as p-type regions, the regions 1102 are doped as n-type regions. In an alternate embodiment, if the regions 402 are doped as n-type regions, the regions 1102 may be doped as p-type regions.

Figure 12:
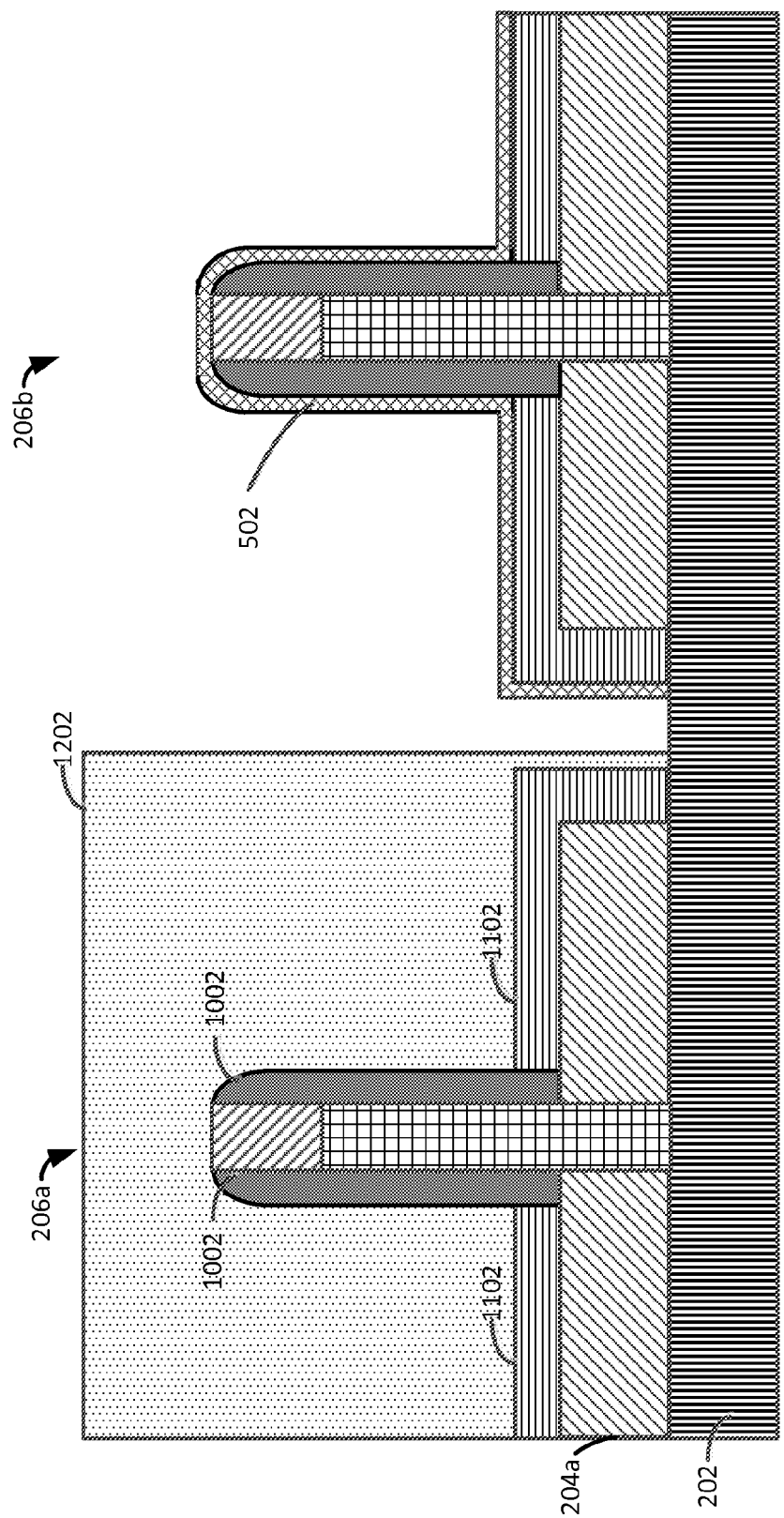
FIG. 12 illustrates the patterning of a masking layer.

FIG. 12 illustrates the patterning of a masking layer 1202 over the source and drain regions 1102, the dummy gate stack 206a, and the spacers 1002. The masking layer 1202 may be formed by, for example, a lithographic patterning and etching process. Following the patterning of the masking layer 1202, an etching process such as, for example, a chemical etching process, is performed that removes exposed portions of the second layer of spacer material 602 (of FIG. 11). The removal of the second layer of spacer material 602 exposes the oxide material 502. The etching process is selective to the oxide layer 502 such that the etching process does not substantially remove the oxide layer 502 material.

Figure 13:
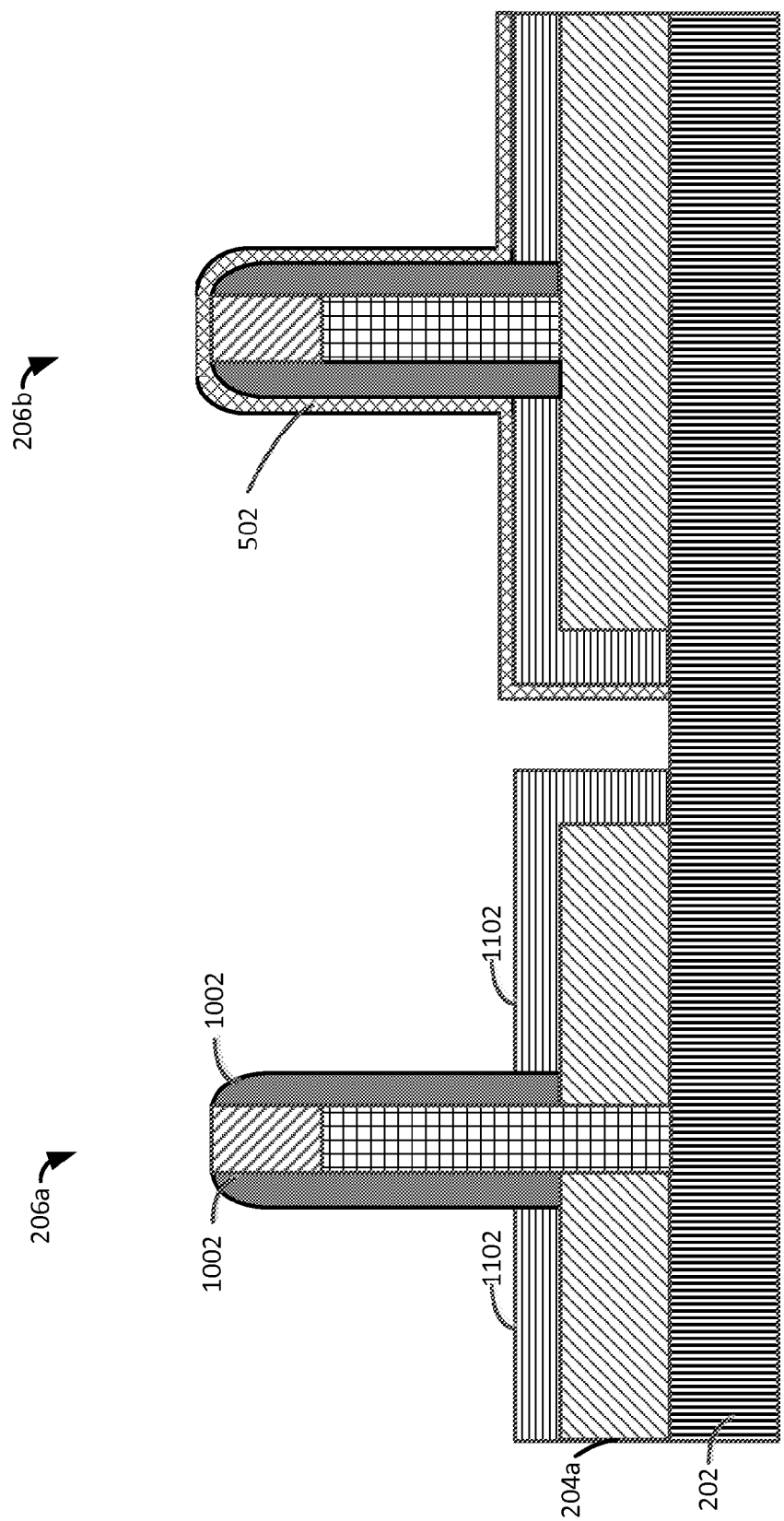
FIG. 13 illustrates the removal of the masking layer.

FIG. 13 illustrates the removal of the masking layer 1202 to expose the source and drain region 1102, the spacers 1002 and the dummy gate stack 206a.

Figure 14:
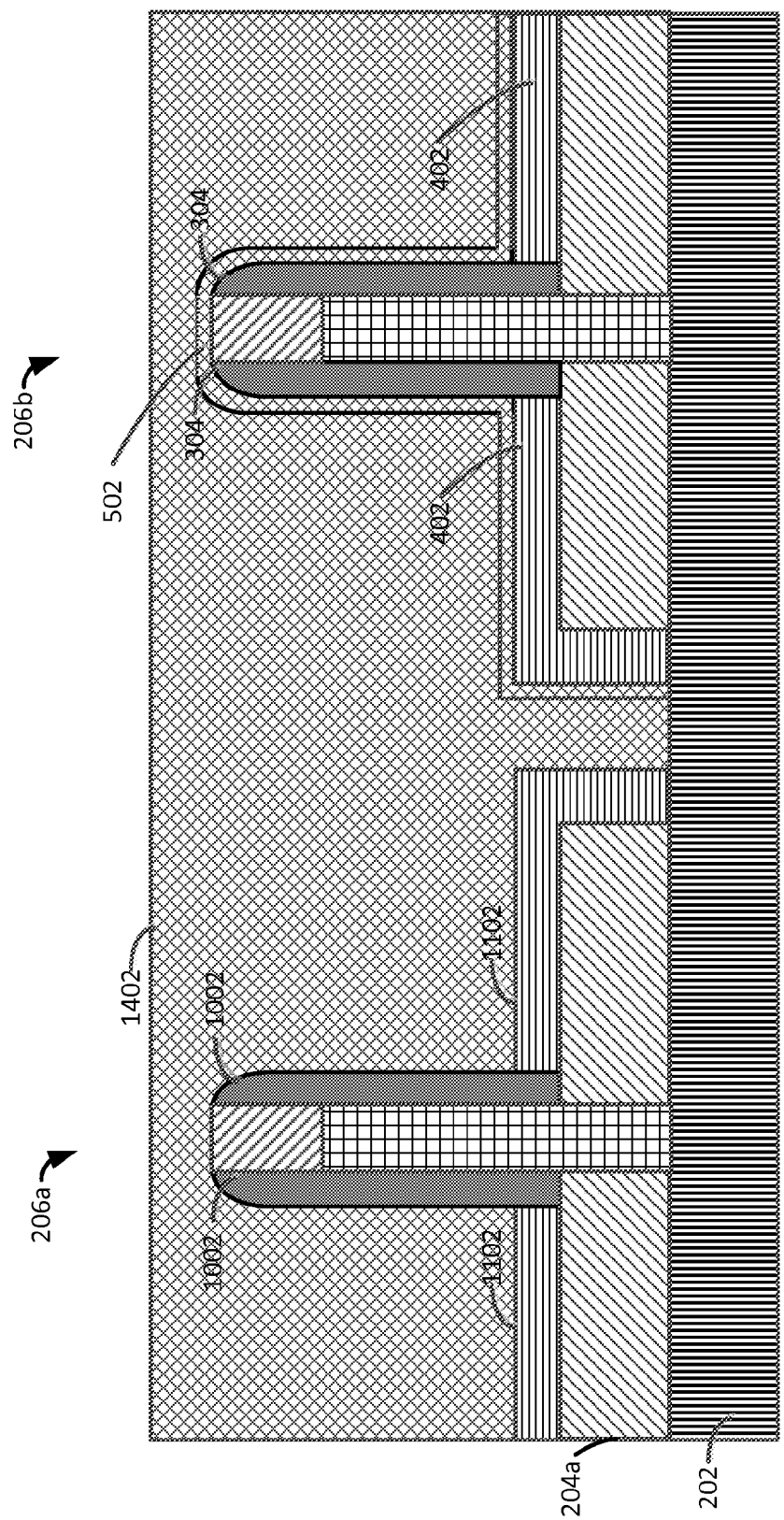
FIG. 14 illustrates the resultant structure following the deposition of an insulating layer.

FIG. 14 illustrates the resultant structure following the deposition of an insulating layer 1402 such as, for example an oxide material layer. The insulating layer 1402 may be formed by, for example, a CVD process. The insulating layer 1402 is formed over the source and drain regions 1002, the dummy gate stack 206a, the spacers 1002 and the oxide layer 502 that is over the dummy gate stack 206b, the spacers 304, and the source and drain regions 402.

FIG. 15 illustrates the resultant structure after a planarizing process such as, for example, chemical mechanical polishing (CMP) has been performed, which removes a portion of the insulator layer 1402 and exposes the dummy gate stacks 206a and 206b (of FIG. 14). The dummy gate stacks 206 are removed, and gate stacks 1502a and 1502b are formed. The gate stacks 1502 include a dielectric layer 1504 and a gate electrode layer 1506. The finFET device 1500a includes the gate stack 1502a, the spacers 1002, and the source and drain regions (active regions) 1102. The finFET device 1500b includes the gate stack 1502b, the spacers 304 and the source and drain regions (active regions) 402. In one exemplary embodiment, the finFET device 1500a is a pFET type device and the finFET device 1500b is an nFET type device. In alternate exemplary embodiments, the finFET device 1500a is an nFET type device and the finFET device 1500b is a pFET type device. The finFET devices 1500a and 1500b have spacers 1002 and 304 that have substantially similar thicknesses (t) for the length of the spacer (i.e., from the top surface of the gate stacks 1502 to the top of the fins 204a and 204b.

The exemplary methods and structures described herein include finFET devices having different type active regions and spacers having substantially similar thicknesses, which improves the performance of the devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming field effect transistors, the method comprising:
forming a first dummy gate stack over a first fin;
forming a second dummy gate stack over a second fin;
depositing a first layer of spacer material on the first dummy gate stack, the first fin, the second dummy gate stack, and the second fin;
patterning a first masking layer on the first dummy gate stack and the first fin;
etching to remove portions of the first layer of spacer material and form a spacer adjacent to the second dummy gate stack;
removing the first masking layer;
epitaxially growing a silicon material on the second fin;
depositing a layer of oxide material on the first layer of spacer material, the first epitaxial material and the second dummy gate stack; and
depositing a second layer of spacer material on the layer of oxide material.

2. The method of claim 1, further comprising:
patterning a second masking layer over the second dummy gate stack and the second fin;
removing exposed portions of the second layer of spacer material;
removing exposed portions of the layer of oxide material; and
etching to remove portions of the first layer of spacer material and form a spacer adjacent to the first dummy gate stack.

3. The method of claim 2, further comprising:
removing the second masking material; and
epitaxially growing a silicon material on the second fin.

4. The method of claim 3, further comprising:
patterning a third masking layer on the first dummy gate stack and the first fin;
removing exposed portions of the second layer of spacer material; and
removing the third masking layer.

5. The method of claim 4, further comprising:
depositing a layer of insulating material over the first fin, the first dummy gate stack, the second fin, and the second dummy gate stack;
removing a portion of the layer of insulating material to expose the first dummy gate stack and the second dummy gate stack;
removing the first dummy gate stack and the second dummy gate stack to expose a channel region of the first fin and a channel region of the second fin;
forming a first gate stack on the channel region of the first fin; and
forming a second gate stack on the channel region of the second fin.

6. The method of claim 1, wherein the silicon material on the first fin includes p-type dopants and the silicon material on the second fin includes n-type dopants.

7. The method of claim 1, wherein the silicon material on the first fin includes n-type dopants and the silicon material on the second fin includes p-type dopants.

8. The method of claim 1, wherein the first layer of spacer material includes a nitride material.

9. The method of claim 1, wherein the second layer of spacer material includes a nitride material.

10. A method for forming spacers of a field effect transistor, the method comprising:
patterning a first fin;
forming a first dummy gate stack on the first fin;
forming a first layer of spacer material on the first fin and the first dummy gate stack;

removing portions of the first layer of spacer material to define a spacer adjacent to the first dummy gate stack;

epitaxially growing a silicon material on exposed portions of the first fin;

forming a layer of oxide material on the silicon material, the spacer, and the dummy gate stack; and forming a second layer of spacer material on the oxide layer.

11. The method of claim 10, further comprising removing the second layer of spacer material from the oxide layer after forming a spacer adjacent to a second dummy gate stack.

12. The method of claim 10, further comprising:

patterning a second fin;

forming a second dummy gate stack on the second fin, wherein the forming the first layer of spacer material includes forming the first layer of spacer material on the second fin and the second gate stack.

13. The method of claim 12, wherein the silicon material on the first fin includes p-type dopants and the silicon material on the second fin includes n-type dopants.

14. The method of claim 12, wherein the silicon material on the first fin includes n-type dopants and the silicon material on the second fin includes p-type dopants.

15. The method of claim 10, wherein the first layer of spacer material includes a nitride material.

16. The method of claim 10, wherein the second layer of spacer material includes a nitride material.

* * * * *